United States Patent
Hung

(10) Patent No.: US 8,603,586 B2
(45) Date of Patent: Dec. 10, 2013

(54) METHOD OF REDUCING SURFACE RESIDUAL DEFECT

(75) Inventor: Chia-Chien Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 547 days.

(21) Appl. No.: 12/116,411

(22) Filed: May 7, 2008

(65) Prior Publication Data
US 2009/0277480 A1 Nov. 12, 2009

(51) Int. Cl.
*B05D 3/12* (2006.01)

(52) U.S. Cl.
USPC .......................................................... 427/337

(58) Field of Classification Search
USPC .......................................................... 427/337
See application file for complete search history.

(56) References Cited

U.S. PATENT DOCUMENTS

| | | | |
|---|---|---|---|
| 5,454,901 A | 10/1995 | Tsuji | |
| 5,858,861 A * | 1/1999 | Weng et al. | 438/439 |
| 5,949,126 A * | 9/1999 | Dawson et al. | 257/513 |
| 6,146,923 A * | 11/2000 | Ohmi et al. | 438/125 |
| 6,340,395 B1 | 1/2002 | Bertrand et al. | |
| 6,348,418 B1 | 2/2002 | Okamura et al. | |
| 6,383,723 B1 * | 5/2002 | Iyer et al. | 430/327 |
| 6,878,646 B1 * | 4/2005 | Tsai et al. | 438/756 |
| 2002/0105089 A1 * | 8/2002 | Tanaka | 257/774 |
| 2002/0119647 A1 * | 8/2002 | Riley et al. | 438/595 |
| 2004/0127068 A1 * | 7/2004 | Furuhashi et al. | 438/778 |
| 2005/0106822 A1 * | 5/2005 | Lee et al. | 438/294 |
| 2005/0142740 A1 * | 6/2005 | Fumitake et al. | 438/257 |
| 2005/0263743 A1 | 12/2005 | Lee | |

FOREIGN PATENT DOCUMENTS

TW 556055 10/2003

OTHER PUBLICATIONS

"Lithography" http://web.archive.org/web/20060304234302/http://www.lithoguru.com/scientist/lithobasics.html Dated via Internet Archive Wayback Machine on Mar. 4, 2006. of www.lithoguru.com/scientist/lithobasics.html.*

* cited by examiner

*Primary Examiner* — Nathan Empie
(74) *Attorney, Agent, or Firm* — J.C. Patents

(57) ABSTRACT

A method of reducing residual defect on a dielectric surface includes performing a treatment process of the dielectric surface prior to a lithograph process. The treatment process includes at least a first wet chemical treatment step and a second wet chemical treatment step.

5 Claims, 2 Drawing Sheets

METHOD OF REDUCING SURFACE RESIDUAL DEFECT

BACKGROUND

1. Field of Invention

The present invention relates to a method of reducing surface residual defect. More particularly, the present invention relates to a method of treatment on a dielectric layer prior to a lithograph process.

2. Description of Related Art

Silicon nitride has been a widely used in the semiconductor manufacturing process for surface passivation. For example, a silicon nitride layer is applied as an etching mask for a silicon oxide layer. Further, since a silicon nitride layer is not easily penetrated by oxygen, a silicon nitride layer can also serve as a mask layer for preventing oxidation on a chip surface in an oxide layer fabricating process. Additionally, a silicon nitride layer is not easily penetrated by moisture; therefore, it has been used as a protection layer for semiconductor devices. Due to its many applications, silicon nitride plays a very important role in the semiconductor manufacturing process.

However, it has been demonstrated that metal contaminants or residual particles are easily bond to the surface of a silicon nitride layer, for example, subsequent to a photoresist removing process or a plasma etching process. As a result, the functions of a silicon nitride layer are greatly compromised.

SUMMARY OF THE INVENTION

The present invention is to provide a method for reducing residual defects being formed on a surface of a dielectric layer.

The present invention is to provide a method of treatment, which is conducted on a dielectric layer prior to any semiconductor process, such as a lithograph process being performed thereon, wherein residual particles that are formed on the treated surface are greatly reduced.

In accordance to an embodiment of the present invention, a substrate is provided. A dielectric layer is disposed on the substrate. In this embodiment, the dielectric layer is a silicon nitride layer. Then, a treatment process is performed on the dielectric layer, wherein the treatment process includes at least a first treatment step and a second treatment step.

According to one embodiment of the invention, the treatment process is conducted prior to a lithograph process.

According to one embodiment of the invention, the first treatment step includes a first wet chemical treatment using a first solution mixture.

According to one embodiment of the invention, the first solution mixture includes at least a mixture of a sulfuric acid solution and a hydrogen peroxide solution.

According to one embodiment of the invention, a volume ratio of the sulfuric acid solution and the hydrogen peroxide solution in the first solution mixture is about 4:1.

According to one embodiment of the invention, the second treatment step includes a second wet chemical treatment using a second solution mixture.

According to one embodiment of the invention, the second solution mixture includes at least a mixture of an ammonium hydroxide solution and a hydrogen peroxide solution.

According to one embodiment of the invention, a volume ratio of the ammonium hydroxide solution, the hydrogen peroxide solution and deionized water in the first solution mixture is about 1:1:5.

In accordance to the present invention, by treating a dielectric layer, such as a silicon nitride layer with the treatment process of the invention, the tendency of residual particles being formed thereon resulted from the subsequent processes, for example, a photoresist removing process, is greatly reduced.

In order to make the aforementioned and other objects, features and advantages of the present invention comprehensible, a preferred embodiment accompanied with figures is described in detail below.

DESCRIPTION OF EMBODIMENTS

The present invention now will be described more fully hereinafter with reference to the accompanying drawings, in which preferred embodiments of the invention are shown.

The method of reducing residual defect on a surface of a layer of the present invention is adopted for preparing a dielectric layer surface, for example, a silicon nitride layer surface, to reduce residual particles, such as photoresist residues, being formed or remained thereon. For example, prior to a semiconductor process, such as a lithograph process, being performed on the dielectric layer, the dielectric layer is surface-treated. Hence, subsequent to the removal of the photoresist and the completion of the lithograph process, the tendency of photoresist residues being formed or absorbed onto the dielectric layer is greatly reduced.

Figure 1:
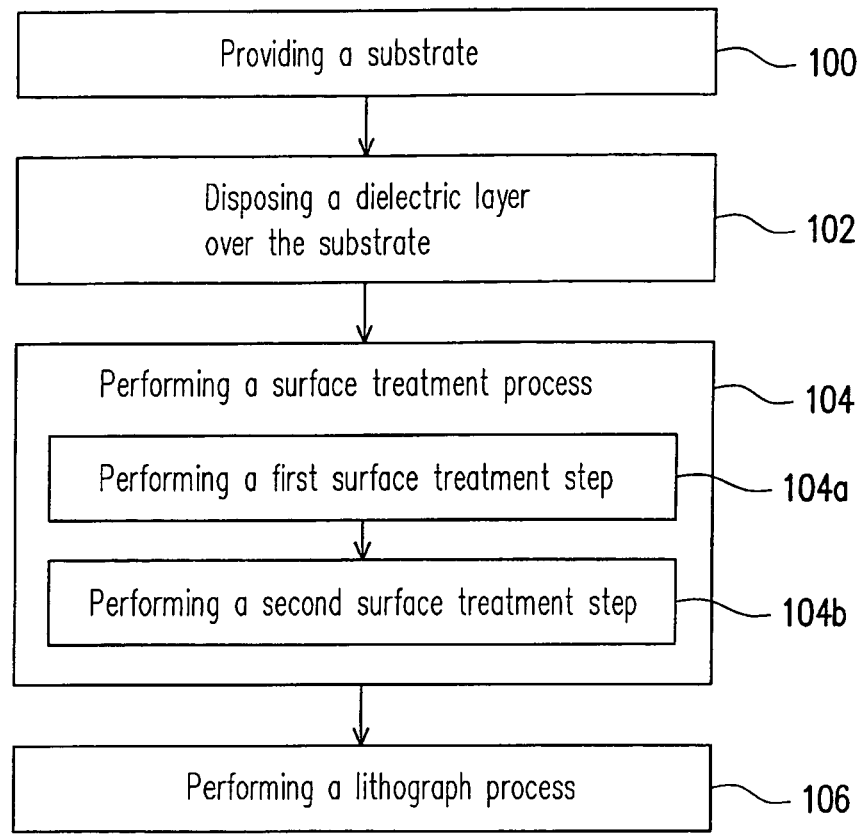
FIG. 1 is a flow diagram of steps in an exemplary method of reducing residual defects according to an embodiment of the present invention.

FIG. 1 is a flow diagram of steps in an exemplary method of reducing residual defects according to an embodiment of the present invention.

Referring to FIG. 1, in Step 100, a substrate is provided, wherein the substrate is constituted with a material includes but not limited to a semiconductor material, such as doped silicon or silicon germanium compound or a silicon-on-insulator, etc. Referring to Step 102, a dielectric layer is disposed over the substrate, wherein the dielectric layer is formed by a typical chemical vapor deposition process, for example. In this embodiment of the invention, the dielectric layer includes a silicon nitride layer. Further, various semiconductor devices or films of different materials may already form on the substrate according to the function of the silicon nitride layer. For example, if the silicon nitride layer is served as an inter-layer dielectric (ILD) layer, transistors are formed on the substrate. If the silicon nitride layer is served as the etching stop layer, the metal film layer or other dielectric materials are formed on the substrate.

Continuing to Step 104, a treatment process is performed. In an embodiment of the invention, the treatment process includes at least a first treatment step 104a and a second treatment step 104b. The first treatment step 104a is, for example, a chemical treatment process, and is performed with the application of a wet batching technique, for example. In this embodiment of the invention, the first treatment step 104a is performed using a first solution mixture, such as a CR solution, which includes at least a sulfuric acid ($H_2SO_4$) solution and a hydrogen peroxide ($H_2O_2$) solution. The volume ratio of the sulfuric acid solution and the hydrogen peroxide solution in the first solution mixture is about 4:1, for example. In this embodiment, the temperature of the first mixture solution in the first treatment step 104*a* is about 80 degrees Celsius.

In this embodiment of the invention, the second treatment step 104*b* is, for example, a chemical treatment process. The second treatment step 104*b* is performed with the application of a wet batching technique, for example, using a second solution mixture, such as a SC1 solution. The second solution mixture includes at least an ammonium hydroxide solution ($NH_4OH$) and a hydrogen peroxide solution ($H_2O_2$). The volume ratio of $NH_4OH$ and $H_2O_2$ in the second solution mixture is about 1 ($NH_4OH$):1($H_2O_2$):5(Deionized water). In this embodiment, the temperature of the second solution mixture in the second treatment step is about 45 degrees Celsius. After the completion of the first and the second treatment steps, a semiconductor process, such as a lithography process including photoresist coating, exposure and development may proceed on a region of the dielectric layer.

It has been demonstrated that a dielectric material, such as silicon nitride has a strong absorption capability. As a result, metal contaminants or metal complexes become easily bond to the surface of a silicon nitride layer to generate unwanted residual defect. In accordance with the present invention, with the application of the first solution mixture ($H_2SO_4+H_2O_2$) the silicon nitride layer and the unwanted residual particles thereon become oxidized. Hence, the absorption of the unwanted residual particles onto the oxidized surface of the silicon nitride layer can be mitigated. On the other hand, due to the release of the ($OH^-$) groups from the second solution mixture ($NH_4OH+H_2O_2$), the oxidized surface of the silicon nitride layer and the unwanted particles become negatively charged. Further, the oxidized surface of the silicon nitride layer is slightly etched by the second solution mixture ($NH_4OH+H_2O_2$) to create a rough surface. Therefore, the repulsion between the unwanted particles and the oxidized surface of the silicon nitride layer is increased and the absorption of the unwanted residual particles onto the oxidized surface of the silicon nitride surface is reduced.

Accordingly, the tendency of photoresist residual particles being formed or absorbed onto the surface of a dielectric layer, such as a silicon nitride layer, in both the photoresist and the non-photoresist regions, is greatly reduced, and the problem of heavy metal contamination inherent in a photoresist removing process or other residual particles resulted from other processes can be obviated.

Figure 2:
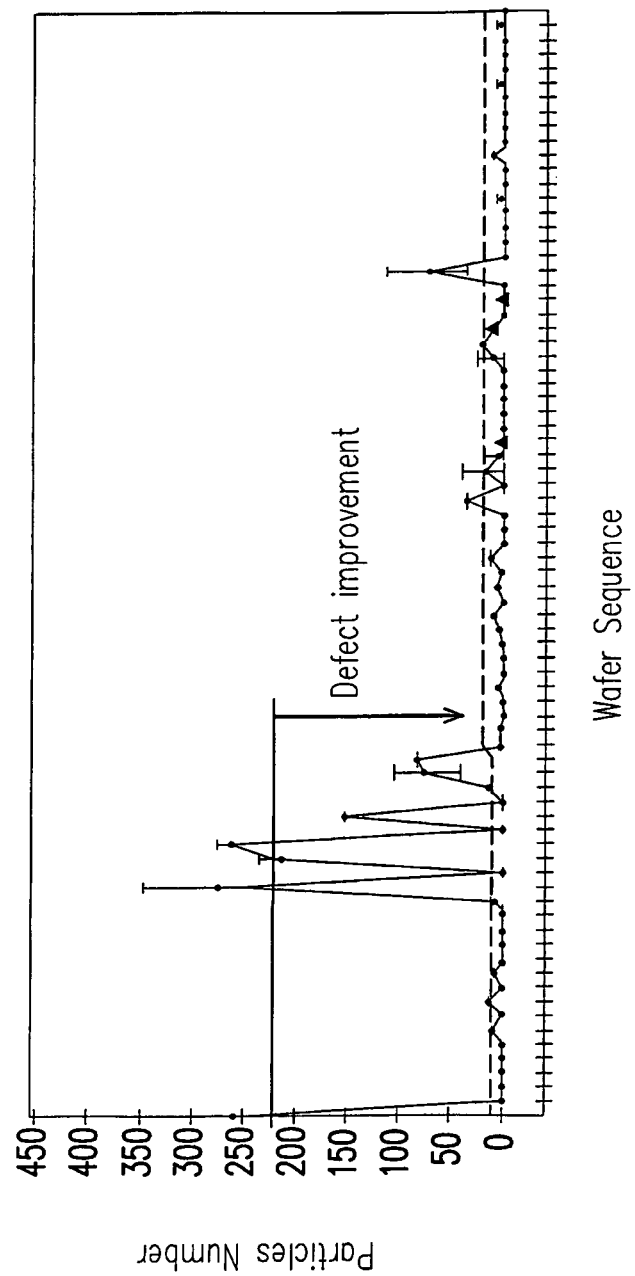
FIG. 2 is a diagram showing the measurement results on defect evaluation of a wafer before and after the treatment process of the invention.

As shown by the results of photoresist (PR) defect evaluation on a wafer in FIG. 2, subsequent to a wet chemical treatment process of the invention, cluster PR defects in the non-photoresist area are greatly reduce. In this study, a wafer that has been surface treated according to the method of the invention has at least 100 to 200 fewer residual particles formed thereon.

In summary, by surface-treating a dielectric layer, such as a silicon nitride layer with the treatment process of the invention, the tendency of residual particles being formed thereon, for example resulted from a photoresist removing process, is greatly reduced.

Although the method of reducing residual particles on a surface is applied to a silicon nitride surface prior to a lithograph process in the aforementioned embodiments, the applications of the method according to this invention are not limited as such. For example, it should be understood by a person of ordinary skill practicing this invention that the treatment process in the method of reducing residual defect on a surface may be conducted prior to other semiconductor fabrication processes for minimizing surface contamination due to the other semiconductor fabrication processes.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A chemical treatment process, the process consisting of: depositing a dielectric layer over a substrate and directly followed by performing a wet chemical treatment step on the dielectric layer to create a rough surface on the dielectric layer, wherein the wet chemical treatment step is conducted a first wet batching technique using a first solution mixture only comprising a sulfuric acid solution and a hydrogen peroxide solution and a second wet batching technique using solution mixture only comprising an ammonium hydroxide solution and a hydrogen peroxide solution, and the first wet batching technique directly follows the step of depositing the dielectric layer, and the second wet batching technique directly follows the first wet batching technique; and after the wet chemical treatment step is performed, directly performing a lithograph process only including photoresist coating, exposure and development to the dielectric layer.

2. The method according to claim 1, wherein the first wet chemical treatment step is conducted at a temperature of about 80 degrees Celsius.

3. The method according to claim 1, wherein the second wet chemical treatment step is conducted at a temperature of about 45 degrees Celsius.

4. The process according to claim 1, wherein a volume ratio of the sulfuric acid solution to the hydrogen peroxide solution in the first solution mixture is about 4:1.

5. The process according to claim 1, wherein a volume ratio of the ammonium hydroxide solution, the hydrogen peroxide solution and deionized water in the second solution mixture is about 1:1:5.

* * * * *